United States Patent
Kobayashi et al.

(10) Patent No.: US 12,109,629 B1
(45) Date of Patent: Oct. 8, 2024

(54) CUTTING TOOL

(71) Applicant: Sumitomo Electric Industries, Ltd., Osaka (JP)

(72) Inventors: Fumiyoshi Kobayashi, Osaka (JP); Anongsack Paseuth, Osaka (JP); Haruko Harada, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 18/681,078

(22) PCT Filed: Jul. 13, 2023

(86) PCT No.: PCT/JP2023/025928
§ 371 (c)(1),
(2) Date: Feb. 5, 2024

(51) Int. Cl.
*B23B 27/14* (2006.01)
*C23C 16/34* (2006.01)
*C23C 16/36* (2006.01)
*C23C 16/40* (2006.01)

(52) U.S. Cl.
CPC ............ *B23B 27/148* (2013.01); *C23C 16/34* (2013.01); *C23C 16/36* (2013.01); *C23C 16/403* (2013.01); *B23B 2228/105* (2013.01)

(58) Field of Classification Search
None
See application file for complete search history.

(56) References Cited

FOREIGN PATENT DOCUMENTS

| JP | 2013-124406 A | 6/2013 | |
|---|---|---|---|
| JP | 2013-223894 A | 10/2013 | |
| JP | 2022-171412 A | 11/2022 | |
| RU | 59624 U1 * | 12/2006 | |
| WO | WO-2022230363 A1 * | 11/2022 | ............ B23B 27/14 |

OTHER PUBLICATIONS

Written Opinion mailed on Aug. 22, 2023, received for PCT Application PCT/JP2023/025928, filed on Jul. 13, 2023, 7 pages including English Translation.
Internation Search Report mailed on Aug. 22, 2023, received for PCT Application PCT/JP2023/025928, filed on Jul. 13, 2023, 6 pages including English Translation.

\* cited by examiner

*Primary Examiner* — Seth Dumbris
(74) *Attorney, Agent, or Firm* — XSENSUS LLP (57) ABSTRACT

A cutting tool comprising a base material and a coating disposed on the base material, wherein the coating comprises a hard particle layer, the hard particle layer is formed from a plurality of hard particles consisting of titanium, silicon, carbon, and nitrogen, the hard particle layer comprises a first region and a second region, a composition of the first region is $Ti_{(1-Xb)}Si_{Xb}CN$, a composition of the second region is $Ti_{(1-Xs)}Si_{Xs}CN$, the Xs and the Xb satisfy relationships of $Xs-Xb \geq 0.01$ and $0 < Xb < Xs \leq 0.10$, the hard particles have a cubic crystal structure, and in the hard particles, a concentration of the silicon changes periodically along a first direction going from the first main surface to the second main surface.

7 Claims, 3 Drawing Sheets

CUTTING TOOL

CROSS-REFERENCE TO RELATED APPLICATION

This application is based on PCT filing PCT/JP2023/025928, filed Jul. 13, 2023, the entire contents of which are incorporated herein by reference.

TECHNICAL FIELD

The present disclosure relates to a cutting tool.

BACKGROUND ART

Conventionally, in order to improve the wear resistance of a cutting tool, a cutting tool having a TiSiCN film formed on a base material has been developed (for example, PTL 1).

CITATION LIST

Patent Literature

PTL 1: WO2022/230363

SUMMARY OF INVENTION

The cutting tool of the present disclosure is
a cutting tool comprising a base material and a coating disposed on the base material,
wherein
the coating comprises a hard particle layer,
the hard particle layer is formed from a plurality of hard particles consisting of titanium, silicon, carbon, and nitrogen,
the hard particle layer comprises a first region and a second region,
the first region is a region sandwiched between a first main surface of the hard particle layer facing forward the base material and a virtual surface S1 at a distance of 0.5 μm from the first main surface toward the hard particle layer,
the second region is a region sandwiched between a second main surface of the hard particle layer opposite to the first main surface and a virtual surface S2 at a distance of 0.5 μm from the second main surface toward the hard particle layer,
a composition of the first region is $Ti_{(1-Xb)}Si_{Xb}CN$,
a composition of the second region is $Ti_{(1-Xs)}Si_{Xs}CN$,
the Xs and the Xb satisfy relationships of $Xs-Xb \geq 0.01$ and $0 < Xb < Xs \leq 0.10$,
the hard particles have a cubic crystal structure, and
in the hard particles, a concentration of the silicon changes periodically along a first direction going from the first main surface to the second main surface.

DETAILED DESCRIPTION

Problem to be Solved by the Present Disclosure

The cutting tool of PTL 1 has a TiSiCN film having high hardness and thus has excellent wear resistance. On the other hand, when a workpiece having high cutting resistance such as FCD700 (spheroidal graphite cast iron) is cut by using the cutting tool of PTL 1, the coating may be destroyed, leading to the end of the tool life. Because of this, there is a demand for a cutting tool that can have a long tool life, particularly even when a workpiece having high cutting resistance is cut.

Therefore, an object of the present disclosure is to provide a cutting tool that can have a long tool life, particularly even when a workpiece having high cutting resistance is cut.

Advantageous Effect of the Present Disclosure

According to the present disclosure, it is possible to provide a cutting tool that can have a long tool life, particularly even when a workpiece having high cutting resistance is cut.

Description of Embodiments

First, aspects of the present disclosure will be listed and described.
(1) The cutting tool of the present disclosure is
a cutting tool comprising a base material and a coating disposed on the base material,
wherein
the coating comprises a hard particle layer,
the hard particle layer is formed from a plurality of hard particles consisting of titanium, silicon, carbon, and nitrogen,
the hard particle layer comprises a first region and a second region,
the first region is a region sandwiched between a first main surface of the hard particle layer facing forward the base material and a virtual surface S1 at a distance of 0.5 μm from the first main surface toward the hard particle layer,
the second region is a region sandwiched between a second main surface of the hard particle layer opposite to the first main surface and a virtual surface S2 at a distance of 0.5 μm from the second main surface toward the hard particle layer,
a composition of the first region is $Ti_{(1-Xb)}Si_{Xb}CN$,
a composition of the second region is $Ti_{(1-Xs)}Si_{Xs}CN$,
the Xs and the Xb satisfy relationships of $Xs-Xb \geq 0.01$ and $0 < Xb < Xs \leq 0.10$,
the hard particles have a cubic crystal structure, and
in the hard particles, a concentration of the silicon changes periodically along a first direction going from the first main surface to the second main surface.

According to the present disclosure, it is possible to provide a cutting tool that can have a long tool life, particularly even when a workpiece having high cutting resistance is cut.

(2) In (1) above, the hard particle layer may have a columnar structure. According to this, the hard particle layer is resistant to a stress in the shear direction, and the wear resistance is improved. Further, the hard particle layer has fewer grain boundaries in a direction perpendicular to the film thickness, and thus there are fewer starting points for destruction, and the breakage resistance is also improved.

(3) In (1) or (2) above, the proportion L1/T1 of the length L1 along the first direction of the hard particles to the thickness T1 of the hard particle layer may be 0.3 or more. According to this, the hard particle layer is resistant to a stress in the shear direction, and the wear resistance is improved. Further, the hard particle layer has fewer grain boundaries in a direction perpendicular to the film thickness, and thus there are fewer starting points for destruction, and the breakage resistance is also improved.

(4) In any of (1) to (3) above, the period width of the concentration of the silicon along the first direction in the hard particles may be 3 nm or more and 20 nm or less. According to this, the strain within the hard particles is maintained, the propagation of a crack is further suppressed in the coating, and the breakage resistance of the cutting tool is further improved.

(5) In any of (1) to (4) above, the average thickness of the hard particle layer may be 2 μm or more and 15 μm or less. According to this, the tool life is further improved.

(6) In any of (1) to (5) above,
the coating may include a base layer provided between the base material and the hard particle layer, and
the base layer may include at least one selected from the group consisting of a TiN layer, a TiC layer, a TiCN layer, a TiBN layer, a TiCNO layer, and an $Al_2O_3$ layer.

By disposing a TiN layer, a TiC layer, a TiCN layer, a TiCNO layer, or a TiBN layer as the base layer, the close adhesion between the base material and the coating can be enhanced. In addition, by using an $Al_2O_3$ layer as the base layer, the oxidation resistance of the coating can be enhanced.

(7) In any of (1) to (6) above,
the coating may include a surface layer provided on the topmost surface of the coating, and
the surface layer may be a TiN layer or an $Al_2O_3$ layer.

According to this, the thermal crack resistance and the wear resistance of the coating are improved.

DETAILS OF THE EMBODIMENTS OF THE PRESENT DISCLOSURE

As used in the present disclosure, the expression of a range in the format "A to B" means the upper limit and the lower limit of the range (that is, A or more and B or less), and when no unit is written in A and a unit is only written in B, the unit for A and the unit for B are the same.

As used in the present disclosure, when a compound or the like is represented by a chemical formula, if the atomic ratio is not particularly limited, the chemical formula shall include all conventionally known atomic ratios, and should not necessarily be limited only to those within the stoichiometric range.

As used in the present disclosure, when one or more numerical values are written as each of the lower limit and the upper limit of a numerical range, a combination of any one numerical value written as the lower limit and any one numerical value written as the upper limit shall also be disclosed. For example, when a1 or more, b1 or more, and c1 or more are written as the lower limit, and a2 or less, b2 or less, and c2 or less are written as the upper limit, a1 or more and a2 or less, a1 or more and b2 or less, a1 or more and c2 or less, b1 or more and a2 or less, b1 or more and b2 or less, b1 or more and c2 or less, c1 or more and a2 or less, c1 or more and b2 or less, and c1 or more and c2 or less shall be disclosed.

In developing a cutting tool that can have a long tool life even when a workpiece having high cutting resistance is cut, the present inventors cut a workpiece having high cutting resistance with a conventional cutting tool and observed the destruction morphology of the coating.

It has been confirmed that when a workpiece having high cutting resistance is cut by using the cutting tool of PTL 1, the load in the shear direction is large on the rake face against which chips rub, and a crack occurs with a fulcrum at a position close to the base material, which causes the destruction of the film to progress. It is presumed that this is because the TiSiCN film has high hardness and thus has excellent wear resistance, but the toughness of the coating is insufficient for cutting working of a workpiece having high cutting resistance.

The present inventors have carried out intensive studies based on the above findings, and as a result, have obtained a cutting tool that can have a long tool life even when a workpiece having high cutting resistance is cut. With reference to the drawings, specific examples of the cutting tool of the present disclosure will be described below. In the drawings of the present disclosure, the same reference signs represent the same portions or equivalent portions. In addition, a dimensional relationship such as length, width, thickness, or depth is appropriately changed for clarity and simplification of the drawings, and does not necessarily represent an actual dimensional relationship.

Embodiment 1: Cutting Tool

A cutting tool of one embodiment of the present disclosure (hereinafter also referred to as "the present embodiment") will be described with reference to FIG. 1 to FIG. 5. A cutting tool 1 of the present embodiment is
a cutting tool comprising a base material 10 and a coating 15 disposed on base material 10, wherein
coating 15 comprises a hard particle layer 11,
hard particle layer 11 is formed from a plurality of hard particles consisting of titanium, silicon, carbon, and nitrogen,
hard particle layer 11 comprises a first region A1 and a second region A2,
first region A1 is a region sandwiched between a first main surface Q1 of hard particle layer 11 facing forward base material 10 and a virtual surface S1 at a distance of 0.5 μm from first main surface Q1 toward hard particle layer 11,
second region A2 is a region sandwiched between a second main surface Q2 of hard particle layer 11 opposite to first main surface Q1 and a virtual surface S2 at a distance of 0.5 μm from second main surface Q2 toward hard particle layer 11,
a composition of first region A1 is $Ti_{(1-Xb)}Si_{Xb}CN$,
a composition of second region A2 is $Ti_{(1-Xs)}Si_{Xs}CN$,
the Xs and the Xb satisfy relationships of Xs−Xb≥0.01 and 0<Xb<Xs≤0.10, the hard particles have a cubic crystal structure, and
in the hard particles, a concentration of the silicon changes periodically along a first direction going from the first main surface to the second main surface.

The cutting tool of the present embodiment can have a long tool life even when a workpiece having high cutting resistance is cut. The reasons for this are unclear, but are presumed to be as shown (i) to (iii) below.

(i) In the cutting tool of the present embodiment, the coating includes a hard particle layer formed from a plurality of hard particles consisting of titanium, silicon, carbon, and nitrogen. The hard particle layer has high hardness. Therefore, the cutting tool having the hard particle layer has excellent wear resistance. Therefore, the cutting tool can have a long tool life.

(ii) In the cutting tool of the present embodiment, the hard particle layer includes a first region on the base material side and a second region on the surface side, the silicon content of the first region is lower than the silicon content of the second region, and the first region is superior in toughness to the second region. Because of this, even when a workpiece having high cutting resistance is cut by using the cutting tool having a hard particle layer, the occurrence of a crack with a fulcrum at a position close to the base material of the hard particle layer is suppressed. Therefore, the cutting tool can have a long tool life.

(iii) In the hard particles of the cutting tool of the present embodiment, the concentration of silicon changes periodically along the first direction going from the first main surface to the second main surface of the hard particle layer. According to this, even if strain occurs in the hard particle and a crack due to cutting occurs on the surface of the coating, propagation of the crack to the base material is effectively suppressed. In addition, the hardness of the hard particle and the hard particle layer is increased, and the wear resistance of the cutting tool is improved. Therefore, the cutting tool can have a long tool life.

<Cutting Tool>

Figure 1:
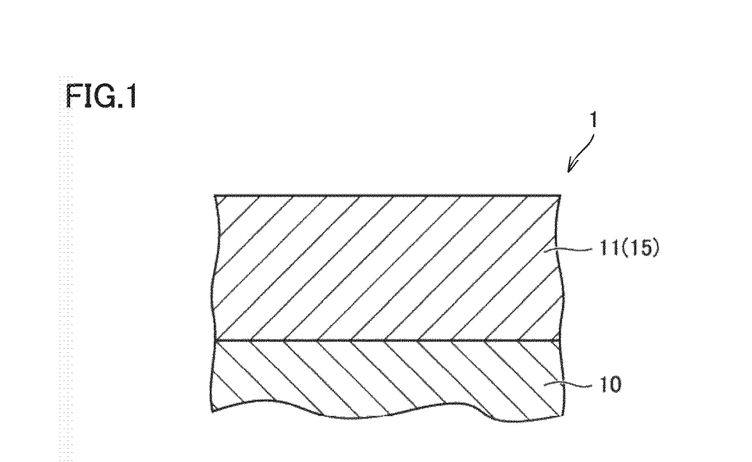
FIG. 1 is a schematic diagram showing one example of a cross section of a cutting tool according to Embodiment 1.

As shown in FIG. 1, a cutting tool 1 of the present embodiment includes a base material 10 and a coating 15 disposed on base material 10. FIG. 1 shows a case where coating 15 is constituted only by a hard particle layer 11. Coating 15 preferably coats at least a part of a portion of the base material involved in cutting, and more preferably coats the entire surface of the base material. The term portion of the base material involved in cutting means a region within a distance of 500 μm from the cutting edge ridgeline on the surface of the base material. Even if a part of the base material is not coated with the coating or the configuration of the coating is partially different, this does not depart from the scope of the present embodiment.

<Type of Cutting Tool>

The cutting tool of the present disclosure can be a drill, an end mill (for example, a ball end mill), an indexable cutting insert for a drill, an indexable cutting insert for an end mill, an indexable cutting insert for milling working, an indexable cutting insert for turning working, a metal saw, a gear cutting tool, a reamer, a tap, or the like.

<Base Material>

Base material 10 includes a rake face and a flank face, and any base material can be used as long as it is conventionally known as a base material of this type. For example, the base material is preferably any of a cemented carbide (for example, WC-base cemented carbide including tungsten carbide and cobalt, the cemented carbide can include a carbonitride of Ti, Ta, Nb, or the like), a cermet (including TiC, TiN, TiCN, or the like as a main component), high-speed steel, a ceramic (such as titanium carbide, silicon carbide, silicon nitride, aluminum nitride, or aluminum oxide), a cubic boron nitride sintered material, and a diamond sintered material.

The base material is formed from a cemented carbide including tungsten carbide and cobalt, wherein the content of cobalt in the cemented carbide may be 5% by mass or more and 11% by mass or less. According to this, the base material has an excellent balance between hardness and strength at a high temperature, and has excellent properties as a base material for a cutting tool for the above uses. When a WC-base cemented carbide is used as the base material, the structure thereof may include free carbon, an abnormal layer referred to as an η phase or an ε phase, or the like.

Further, the base material may have the surface thereof modified. For example, in the case of a cemented carbide, a β-free layer may be formed on the surface thereof, and in the case of a cermet, a hardened surface layer may be formed. The base material exhibits the desired effect even if the surface thereof has been modified.

When the cutting tool is an indexable cutting insert or the like, the base material may or may not have a chip breaker. As the shape of the cutting edge ridgeline portion, any shape of a sharp edge (a ridge where a rake face and a flank face intersect), a honing (a shape obtained by rounding a sharp edge), a negative land (a chamfered shape), a shape obtained by combining a honing and a negative land, and the like can be adopted.

<Coating>

<<Configuration of Coating>>

The coating of the present embodiment includes a hard particle layer. The coating of the present embodiment may include a different layer as long as the coating includes a hard particle layer.

Figure 2:
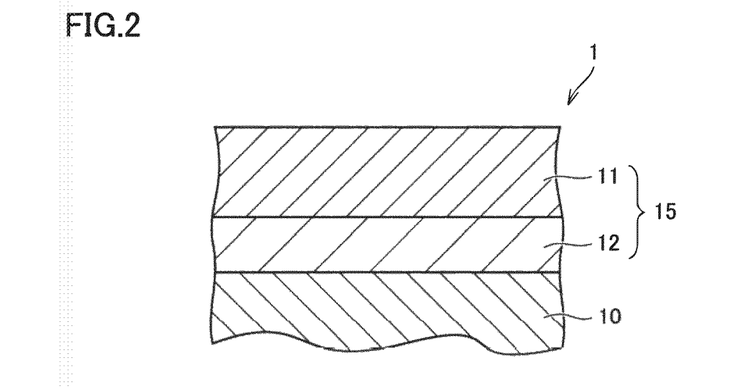
FIG. 2 is a schematic diagram showing a different example of the cross section of the cutting tool according to Embodiment 1.

For example, as shown in a cutting tool 1 of FIG. 2, a coating 15 can include, in addition to a hard particle layer 11, a base layer 12 disposed between a base material 10 and hard particle layer 11.

Figure 3:
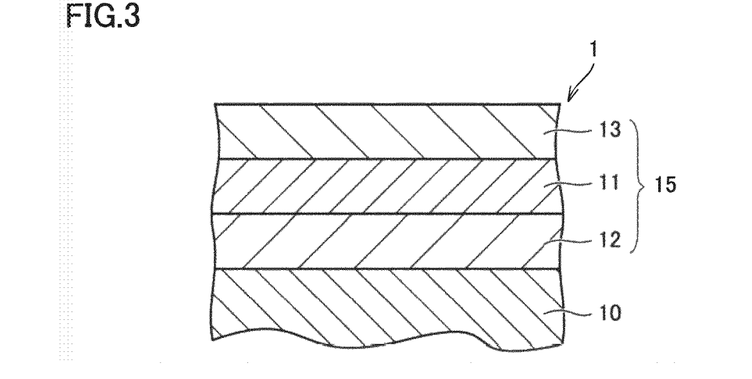
FIG. 3 is a schematic diagram showing a different example of the cross section of the cutting tool according to Embodiment 1.

As shown in a cutting tool 1 of FIG. 3, a coating 15 can include, in addition to a hard particle layer 11 and a base layer 12, a surface layer 13 disposed on hard particle layer 11.

Figure 4:
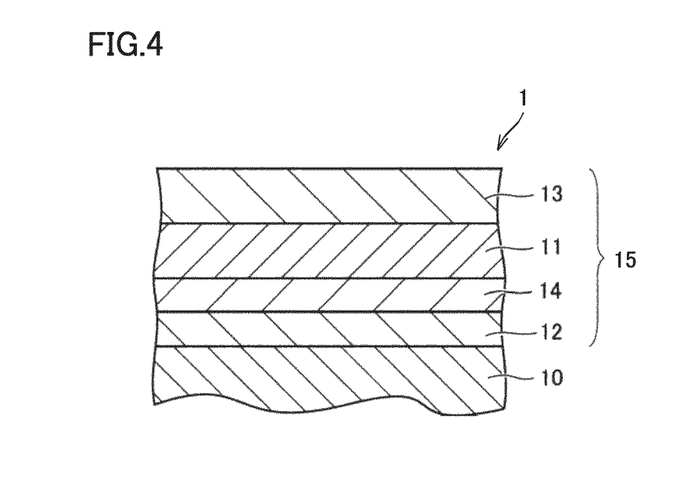
FIG. 4 is a schematic diagram showing a different example of the cross section of the cutting tool according to Embodiment 1.

As shown in a cutting tool 1 of FIG. 4, a coating 15 can include, in addition to a hard particle layer 11, a base layer 12, and a surface layer 13, an intermediate layer 14 disposed between base layer 12 and hard particle layer 11.

The details of the hard particle layer, the base layer, the intermediate layer, and the surface layer will be described later.

<<Thickness of Coating>>

The thickness of the coating of the present embodiment may be 2 μm or more and 30 μm or less. Here, the term thickness of the coating means the thickness of the entire coating. When the thickness of the entire coating is 3 μm or more, the coating can have excellent wear resistance. On the other hand, when the thickness of the entire coating is 30 μm or less, it is possible to suppress the occurrence of peeling or destruction of the coating when a large stress is applied between the coating and the base material during cutting working. The lower limit of the thickness of the entire coating may be 2 μm or more, 5 μm or more, 8 μm or more, or 10 μm or more, from the viewpoint of improving the wear resistance. The upper limit of the thickness of the entire coating may be 30 μm or less, 25 μm or less, or 20 μm or less, from the viewpoint of suppressing the occurrence of peeling or destruction of the coating. The thickness of the entire coating may be 5 μm or more and 25 μm or less, or 8 μm or more or 20 μm or less.

In the present disclosure, the thickness of the coating is measured by the following procedure. The cutting tool is cut out in a cross section parallel to the normal direction of the surface to obtain a sample for measurement having an exposed cross section of the coating. The sample for measurement is observed by scanning transmission electron microscopy (STEM) to measure the thickness of the coating. The sample for measurement is a thin sliced sample worked by using an ion slicer or the like. Examples of the scanning transmission electron microscope include JEM-2100F (trademark) manufactured by JEOL Ltd. The measurement conditions are an acceleration voltage of 200 kV and an amount of current of 0.3 nA.

In the present disclosure, when the term "thickness" is used, the thickness means the average thickness. Specifically, the observation magnification of the sample for measurement is 10000 times, and a rectangular measurement field of view having (a length parallel to the surface of the cutting tool of 100 μm)×(a length including the total thickness of the coating) is set on an electron microscope image, the thickness widths at 10 locations are measured in the field of view, and the average value thereof is defined as the "thickness." The thickness (average thickness) of each layer described below is also similarly measured and calculated.

It has been confirmed that as long as the measurement is carried out on the same sample, even if the measurement is carried out a plurality of times by changing the selection location of the measurement field of view, there is little variation in the measurement results, and that even if the measurement field of view is arbitrarily set, it is not contrived.

<Hard Particle Layer>
<<Composition of Hard Particle Layer>>

The hard particle layer of the present embodiment is formed from a plurality of hard particles consisting of titanium, silicon, carbon, and nitrogen. The hard particle layer can also be expressed as a TiSiCN layer formed from a hard particle consisting of TiSiCN. The TiSiCN layer has high hardness. Therefore, the cutting tool having the TiSiCN layer has excellent wear resistance. The hard particle layer can include an impurity element along with titanium, silicon, carbon, and nitrogen, as long as the effect of the present disclosure is not impaired. Examples of the impurity element include chlorine, cobalt, tungsten, and oxygen. The content of the impurity element in the hard particle layer can be, for example, 0.5 atomic % or less. The content of the impurity element in the hard particle layer is measured by EDX (Energy Dispersive X-ray Spectroscopy) attached to TEM (Transmission Electron Microscope) (TEM-EDX).

Figure 5:
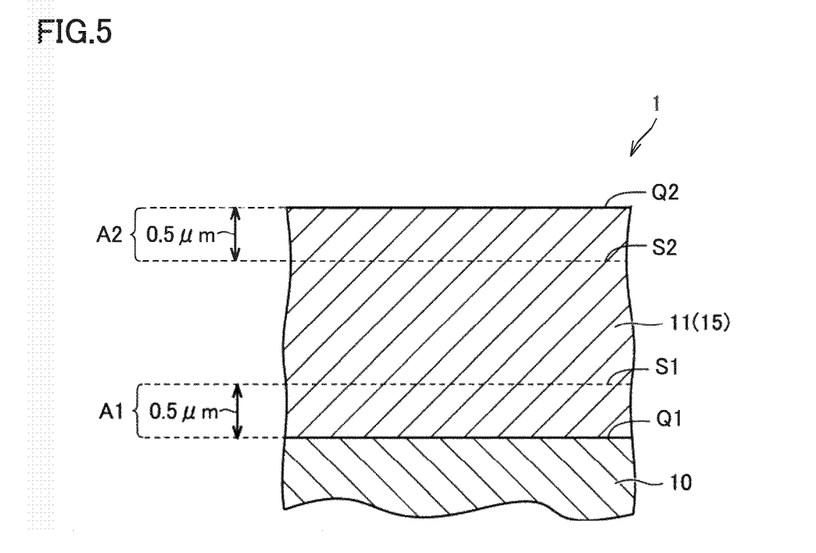
FIG. 5 is a schematic diagram showing a different example of the cross section of the cutting tool according to Embodiment 1.

As shown FIG. 5, a hard particle layer 11 includes a first region A1 and a second region A2. First region A1 is a region sandwiched between a first main surface Q1 of hard particle layer 11 facing forward base material 10 and a virtual surface S1 at a distance of 0.5 μm from first main surface Q1 toward hard particle layer 11. Second region A2 is a region sandwiched between a second main surface Q2 of hard particle layer 11 opposite to first main surface Q1 and a virtual surface S2 at a distance of 0.5 μm from second main surface Q2 toward the hard particle layer.

The composition of the first region is $Ti_{(1-Xb)}Si_{Xb}CN$, and the composition of the second region is $Ti_{(1-Xs)}Si_{Xs}CN$. Here, Xs and Xb satisfy relationships of Xs-Xb≥0.01 and 0<Xb<Xs≤0.10.

The lower limit of Xs-Xb is 0.01 or more, and may be 0.02 or more, 0.03 or more, or 0.04 or more. The upper limit of Xs-Xb may be 0.09 or less, 0.08 or less, or 0.07 or less. Xs-Xb may be 0.01 or more and 0.09 or less, 0.02 or more and 0.08 or less, 0.03 or more and 0.07 or less, or 0.04 or more and 0.07 or less.

The lower limit of Xb may be 0.01 or more, 0.02 or more, or 0.03 or more. The upper limit of Xb may be 0.09 or less, 0.08 or less, or 0.07 or less. Xb may be 0.01 or more and 0.09 or less, 0.02 or more and 0.08 or less, or 0.03 or more and 0.07 or less.

The lower limit of Xs may be 0.02 or more, 0.03 or more, or 0.04 or more. The upper limit of Xs may be 0.10 or less, 0.09 or less, or 0.08 or less. Xs may be 0.02 or more and 0.10 or less, 0.03 or more and 0.09 or less, or 0.04 or more and 0.08 or less.

In the present disclosure, the composition $Ti_{(1-Xb)}Si_{Xb}CN$ of the first region and the composition $Ti_{(1-Xs)}Si_{Xs}CN$ of the second region are measured by the following procedure.

(A1) The cutting tool is cut out with a diamond wire along the normal line of the surface of the cutting tool to expose a cross section of the hard particle layer. Focused ion beam working (hereinafter also referred to as "FIB working") is carried out on the exposed cross section to bring the cross section into a mirror surface state.

(A2) On the FIB worked cross section, line analysis is carried out along the thickness direction of the coating by EDX attached to SEM (Scanning Electron Microscopy) (SEM-EDX) to measure the composition. The beam diameter for line analysis is 0.9 nm or less, the scan interval is 50 nm, and the acceleration voltage is 15 kV. Based on results of the line analysis, a region A formed from titanium, silicon, carbon, and nitrogen, excluding chlorine, tungsten, cobalt, and oxygen, which are impurity elements, is identified. On the above cross section, the identification of region A is carried out at 3 locations that do not overlap with each other and are 1 μm or more apart from each other. On the above cross section, a line connecting the positions, closest to the base material, of regions A at the 3 locations corresponds to first main surface Q1 of the hard particle layer on the base material side. On the above cross section, a line connecting the positions, farthest from the base material, of regions A at the 3 locations corresponds to second main surface Q2 of the hard particle layer opposite to first main surface Q1. On the above cross section, a region sandwiched between first main surface Q1 and second main surface Q2 corresponds to hard particle layer 11.

(A3) On the FIB worked cross section, the first region and the second region are identified within the hard particle layer. First region A1 is a region sandwiched between a first main surface Q1 of hard particle layer 11 facing forward base material 10 and a virtual surface S1 at a distance of 0.5 μm from first main surface Q1 toward hard particle layer 11. Second region A2 is a region sandwiched between a second main surface Q2 of hard particle layer 11 opposite to first main surface Q1 and a virtual surface S2 at a distance of 0.5 μm from second main surface Q2 toward hard particle layer 11.

(A4) In first region A1, rectangular analysis is carried out by SEM-EDX to identify the composition of first region A1. The rectangular analysis is carried out on 0.5 μm×2 μm rectangular measurement regions at 3 locations that do not overlap with each other, set within first region A1. In the present disclosure, the average composition of the measurement regions at the 3 locations corresponds to the composition $Ti_{(1-Xb)}Si_{Xb}CN$ of first region A1. Xb can be obtained by the above procedure.

Within second region A2, rectangular analysis is carried out by SEM-EDX to identify the composition of second region A2. The rectangular analysis is carried out on 0.5 µm×2 µm rectangular measurement regions at 3 locations that do not overlap with each other, set within second region A2. In the present disclosure, the average composition of the measurement regions at the 3 locations corresponds to the composition $Ti_{(1-Xs)}Si_{Xs}CN$ of second region. Xs can be obtained by the above procedure.

It has been confirmed that as long as the measurement is carried out on the same sample, even if the measurement is carried out a plurality of times by changing the cutting-out position of the cutting tool or the measurement region, there is little variation in the measurement results.

The hard particle layer of the present embodiment may include a third region sandwiched the first region and the second region. The composition of the third region is not particularly limited as long as the effect of the present disclosure is not impaired. The composition of the third region can be a composition that can maintain the continuity of the structure of the hard particle layer. It has been confirmed that in the composition $Ti_{(1-Xm)}Si_{Xm}CN$ of the third region, if $Xb×0.9<Xm<Xs×1.1$ is satisfied, the effect of the present disclosure is not impaired. The composition of the third region is measured by the same method as the method for measuring the composition of the first region described above.

<<Crystal Structure of Hard Particles>>

In the present embodiment, the hard particles have a cubic crystal structure. When the hard particles have a cubic crystal structure, both excellent wear resistance and high toughness can be achieved. It can be confirmed by pattern analysis of selected area electron beam diffraction that the hard particles have a cubic crystal structure.

<<Changes in Silicone Concentration in Hard Particles>>

In the hard particles of the present embodiment, the concentration of silicon changes periodically along the first direction going from the first main surface to the second main surface of the hard particle layer. It is confirmed by the following procedure that in the hard particles, the concentration of silicon changes periodically along the first direction going from the first main surface to the second main surface of the hard particle layer.

(B1) The cutting tool is cut out with a diamond wire along the normal line of the surface of the cutting tool to expose a cross section of the hard particle layer. Focused ion beam working (hereinafter also referred to as "FIB working") is carried out on the exposed cross section to bring the cross section into a mirror surface state.

(B2) The FIB worked cross section is observed by using a bright-field scanning electron microscope (BF-SEM) to identify one hard particle. Next, a BE-STEM image of the one hard particle identified is obtained.

(B3) A measurement region (size: 100 nm×100 nm) is set in such a way as to include a region in which 10 or more layers shown in white and 10 or more layers shown in black are stacked, on the BF-STEM image. The layers shown in black are regions having a high silicon content, and the layers shown in white are regions having a low silicon content.

(B4) The stacking direction of the layers shown in white (hereinafter also referred to as "white layers") and the layers shown in black (hereinafter also referred to as "black layers") is identified in the measurement region on the BF-STEM image. Specifically, a selected area region electron beam diffraction pattern and the stacking direction of the white layers and the black layers are superimposed on each other to identify the stacking direction from an orientation shown by diffraction spots.

(B5) In the measurement region on the BF-STEM image, line analysis is carried out along the stacking direction by EDX (Energy Dispersive X-ray Spectroscopy) attached to STEM to measure the composition. The beam diameter for line analysis is 0.5 nm or less, the scan interval is 0.5 nm, and the length of line analysis is 50 nm.

(B6) A graph showing the line analysis results in a coordinate system in which the X axis represents the distance from the measurement start point, and the Y axis represents the percentage of the number of atoms of silicon, $A_{Si}$, to the sum of the number of atoms of titanium, $A_{Ti}$, and the number of atoms of silicon, $A_{Si}$, ($\{A_{Si}/(A_{Ti}+A_{Si})\}×100$), is prepared. In the graph, the average of $\{A_{Si}/(A_{Ti}+A_{Si})\}×100$ (hereinafter also referred to as the "average") in the measurement region is calculated. It is confirmed that when as the distance from the measurement start point increases, a region in which $\{A_{Si}/(A_{Ti}+A_{Si})\}$ is larger than the average value and a region in which $\{A_{Si}/(A_{Ti}+A_{Si})\}$ is smaller than the average value are alternately present, the concentration of silicon changes periodically along the first direction going from the first main surface to the second main surface of the hard particle layer in the hard particles.

It has been confirmed that as long as the measurement is carried out on the same sample, even if the measurement is carried out a plurality of times by changing the hard particle identified in (B2) above, there is little variation in the measurement results.

<<Period Width of Concentration of Silicon in Hard Particles>>

In the hard particles of the present embodiment, the period width of the concentration of silicon along the first direction going from the first main surface to the second main surface of the hard particle layer may be 3 nm or more and 20 nm or less. According to this, the strain within the hard particles is maintained, the propagation of a crack is further suppressed in the coating, and the breakage resistance of the cutting tool is further improved. The period width of the concentration of silicon may be 3 nm or more and 15 nm or less, or 5 nm or more and 10 nm or less.

As used in the present disclosure, the method for measuring the period width of the concentration of silicon is as follows. A measurement region is set by the same method as in (B1) to (B3) above. A Fourier transform is carried out on the measurement region to obtain a Fourier transform image. In the Fourier transform image, the periodicity within the measurement region appears as a spot. The period width is calculated by calculating the reciprocal of the distance between the spot and the center of the image showing the maximum intensity in the Fourier transform image.

It has been confirmed that as long as the measurement is carried out on the same sample, even if the measurement is carried out a plurality of times by changing the measurement location, there is little variation in the measurement results.

<<Structure of Hard Particle Layer>>

The hard particle layer of the present embodiment may have a columnar structure. According to this, the hard particle layer is resistant to a stress in the shear direction, and the wear resistance is improved. Further, the hard particle layer has fewer grain boundaries in a direction perpendicular to the film thickness, and thus there are fewer starting points for destruction, and the breakage resistance is also improved.

In the present disclosure, the hard particle layer having a columnar structure means that the percentage (N1/N)×100 of the number N1 of first hard particles having an aspect ratio of 3 or more to the number N of all hard particles constituting the hard particle layer is 50% or more. The hard particle layer having a columnar structure is specifically confirmed by the following procedure.

(C1) The cutting tool is cut out with a diamond wire along the normal line of the surface of the cutting tool to expose a cross section of the hard particle layer. Focused ion beam working (hereinafter also referred to as "FIB working") is carried out on the exposed cross section to bring the cross section into a mirror surface state.

(C2) EBSD analysis is carried out under the following measurement conditions on the FIB worked cross section by using a field emission scanning electron microscope (FE-SEM) equipped with an electron backscatter diffraction apparatus (EBSD apparatus) (product name: "SUPRA35VP," manufactured by Carl Zeiss AG). The regions in which EBSD analysis is carried out (hereinafter also referred to as the analytical regions) are rectangular regions at 3 locations that do not overlap with each other, provided within the hard particle layer. The size of the analytical region is a rectangle having a length in a direction parallel to the base material of 20 µm or more. The length in the thickness direction of the coating in the analytical region can be appropriately set depending on the thickness of the hard particle layer. The length in the thickness direction of the coating in the analytical region is set, for example, in such a way as to be 90% or more of the thickness of the hard particle layer.

Measurement Conditions

Acceleration voltage: 15 kV
Current value: 1.8 nA
Irradiation current: 60 µm (with HC)
Exp: Long 0.03 s
Binning: 8×8
WD: 15 mm
Tilt: 70°
Step size: 0.02 µm
BKD: Background Subtraction,
Dynamic Background Subtraction,
Normalize Intensity histogram
Imaging magnification: 20000 times
Grain boundary definition: 15° or more (C3) Data collected by the EBSD analysis is subjected to cleanup processing by recognizing only data that satisfies CI>0.1 by a CI Dilation method (single Interation) and Grain CI Standardization. The CI value is calculated by a Voting method. Specifically, the CI value is obtained by CI=(V1−V2)/Videal (V1, 2: first, second solutions, Videal: ideal solution).

(C4) The EBSD analysis results are analyzed by using commercially available software (trade name: "OIM 7.1," manufactured by TSL Solutions K.K.) to create IPF maps (Inverse Pole Figure map) for the analytical regions. In the creation of the IPF maps, a boundary having a misorientation angle between adjacent measurement points of 15° or more is defined as a crystal grain boundary. In the IPF maps, the shape of each crystal grain is shown, and the orientation of each crystal grain is shown by color coding.

(C5) The aspect ratio is measured for each of all hard particles within the IPF map for each analytical region by using the above software ("OIM 7.1"). The aspect ratio of the hard particle is the ratio b/a of the minor axis diameter b to the major axis diameter a and of the hard particle. In the present disclosure, the major axis diameter a is the maximum diameter across the hard particle observed in the above cross section, and the minor axis diameter b is the maximum diameter of the hard particle along a direction perpendicular to the major axis diameter a. In the present disclosure, the hard particles within the IPF map for the analytical region include both hard particles all of which are present within the IPF map for the analytical region, and hard particles at least some of which are present within the IPF map for the analytical region.

(C6) The percentage (n1/n)×100 of the number n1 of first hard particles having an aspect ratio of 3 or more to the number n of all hard particles within the IPF map for each analytical region is calculated. In the present disclosure, the average of the percentages (n1/n)×100 in the IPF maps for the analytical regions at the 3 locations corresponds to the percentage (N1/N)×100 of the number N1 of first hard particles having an aspect ratio of 3 or more to the number N of all hard particles constituting the hard particle layer. When the percentage (N1/N)×100 is 50% or more, it is confirmed that the hard particle layer has a columnar structure.

It has been confirmed that as long as the measurement is carried out on the same sample, even if the measurement is carried out a plurality of times by changing the cutting-out position of the cutting tool or the measurement region, there is little variation in the measurement results.

In the hard particle layer of the present embodiment, the lower limit of the percentage (N1/N)×100 may be 60% or more, 70% or more, 80% or more, or 90% or more. The upper limit of the percentage (N1/N)×100 may be, for example, 100% or less. The percentage (N1/N)×100 may be 60% or more and 100% or less, 70% or more and 100% or less, 80% or more and 100% or less, or 90% or more and 100% or less.

In the present embodiment, the proportion L/T of the length L along the first direction of the hard particles to the thickness T of the hard particle layer may be 0.3 or more. According to this, the hard particle layer is resistant to a stress in the shear direction, and the wear resistance is improved. Further, the hard particle layer has fewer grain boundaries in a direction perpendicular to the film thickness, and thus there are fewer starting points for destruction, and the breakage resistance is also improved.

In the present embodiment, the lower limit of the proportion L/T may be 0.4 or more, 0.5 or more, or 0.6 or more, from the viewpoint of improving the wear resistance and the breakage resistance. The upper limit of the proportion L/T may be 1.0 or less, or 0.9 or less. The proportion L/T may be 0.3 or more and 1.0 or less, 0.4 or more and 1.0 or less, 0.5 or more and 0.9 or less, or 0.6 or more and 0.9 or less.

In the present embodiment, the thickness T of the hard particle layer and the length L along the first direction of the hard particles are measured by the following procedures.

(D1) The IPF maps for the analytical regions are created by the same procedure as the procedure of (C1) to (C4) of the method for confirming that the hard particle layer has a columnar structure. In the present procedure, the analytical regions in (C1) are rectangular regions having (a length parallel to the surface of the cutting tool of 100 µm)×(a length including the total thickness of the coating) at 3 locations that do not overlap with each other.

(D2) By using the software ("OIM 7.1"), the thickness widths at 10 locations are measured along the first direction going from the first main surface to the second main surface of the hard particle layer in the IPF map for each analytical region to calculate the average value t thereof. Here, the first direction is perpendicular to the first main surface of the hard particle layer. In the present disclosure, the average of the average values t for the analytical regions at the 3 locations corresponds to the thickness T of the hard particle layer.

(D3) By using the software ("OIM 7.1"), the length along the first direction is measured for each of all hard particles within the IPF map for each analytical region to calculate the average value L1 thereof. In the present disclosure, the hard particles within the IPF map for the analytical region include both hard particles all of which are present within the IPF map for the analytical region, and hard particles at least some of which are present within the IPF map. In the present disclosure, the average of the average values L1 for the analytical regions at the 3 locations corresponds to the length L along the first direction of the hard particles.

It has been confirmed that as long as the measurement is carried out on the same sample, even if the measurement is carried out a plurality of times by changing the cutting-out position of the cutting tool or the measurement region, there is little variation in the measurement results.

<<Thickness of Hard Particle Layer>>

The thickness of the hard particle layer of the present embodiment may be 2 μm or more and 15 μm or less. When the thickness of the hard particle layer is 2 μm or more, the hard particle layer can have excellent wear resistance. On the other hand, when the thickness of the hard particle layer is 15 μm or less, it is possible to suppress the occurrence of peeling or destruction of the coating when a large stress is applied between the coating and the base material during cutting working. The lower limit of the thickness of the hard particle layer may be 4 μm or more, 6 μm or more, or 8 μm or more, from the viewpoint of improving the wear resistance. The upper limit of the thickness of the hard particle layer may be 15 μm or less, or 10 μm or less, from the viewpoint of suppressing the occurrence of peeling or destruction of the coating. The thickness of the hard particle layer may be 4 μm or more and 15 μm or less, or 6 μm or more or 10 μm or less.

<Base Layer>

The coating of Embodiment 1 can include a base layer provided between the base material and the hard particle layer. The base layer can include at least one selected from the group consisting of a TiN layer, a TiC layer, a TiCN layer, a TiBN layer, a TiCNO layer, and an $Al_2O_3$ layer.

By disposing a TiN layer, a TiC layer, a TiCN layer, a TiCNO layer, or a TiBN layer directly on the base material as the base layer, the close adhesion between the base material and the coating can be enhanced. By using an $Al_2O_3$ layer as the base layer, the oxidation resistance of the coating can be enhanced. The average thickness of the base layer may be 0.1 μm or more and 20 μm or less. According to this, the coating can have excellent wear resistance and breakage resistance.

<Surface Layer>

The coating of Embodiment 1 can include a surface layer provided on the topmost surface of the coating. The surface layer may be a TiN layer or an $Al_2O_3$ layer. The TiN layer has a clear color (exhibits a gold color) and thus the use thereof as the surface layer has the advantage of easy identification of a corner of the cutting insert after used for cutting (identification of a used site). By using an $Al_2O_3$ layer as the surface layer, the oxidation resistance of the coating can be enhanced.

The average thickness of the surface layer may be 0.5 μm or more and 10 μm or less. According to this, the close adhesion between the surface layer and an adjacent layer is improved.

<Intermediate Layer>

The coating of Embodiment 1 can include an intermediate layer disposed between the base layer and the hard particle layer. When the base layer is a TiN layer, the intermediate layer is preferably a TiCN layer. The TiCN layer has excellent wear resistance, and thus can impart more suitable wear resistance to the coating. The average thickness of the intermediate layer may be 1 μm or more and 20 μm or less.

Embodiment 2: Method for Manufacturing Cutting Tool

One example of a method for manufacturing the cutting tool according to Embodiment 1 will be described. The method for manufacturing the cutting tool according to Embodiment 1 can include a first step of preparing a base material, and a second step of forming a coating on the base material to obtain a cutting tool.

<First Step>

In the first step, a base material is prepared. Details of the base material have been described in Embodiment 1, and thus the description thereof will not be repeated.

<Second Step>

Next, in the second step, a coating is formed on the base material to obtain a cutting tool. The coating is formed by using, for example, the CVD apparatus shown in FIG. 6. A plurality of base material setting jigs 52 holding base materials 10 can be installed in a CVD apparatus 50, and these are covered with a reaction vessel 53 made of a heat-resistant alloy steel. In addition, a temperature control apparatus 54 is disposed around reaction vessel 53, and the temperature in reaction vessel 53 can be controlled by temperature control apparatus 54.

Figure 6:
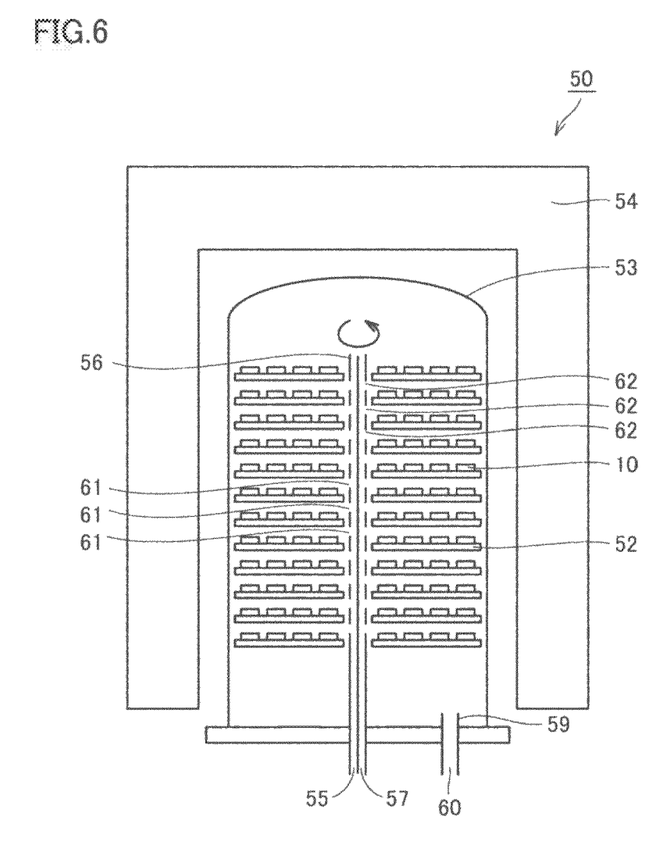
FIG. 6 is a schematic cross-sectional view of one example of a CVD apparatus used for manufacturing a cutting tool according to Embodiment 2.

A nozzle 56 having three introduction ports 55 and 57 (the remaining one introduction port is not shown) is disposed in CVD apparatus 50. Nozzle 56 is disposed in such a way as to pass through a region in which base material setting jigs 52 are disposed. A plurality of jet holes (first jet holes 61, second jet holes 62, third jet holes (not shown)) are formed in a portion in the vicinity of base material setting jigs 52 of nozzle 56.

In FIG. 6, the gases introduced into nozzle 56 from introduction ports 55, 57, and the remaining one introduction port (not shown) are introduced into reaction vessel 53 through different jet holes, respectively, without being mixed in nozzle 56. This nozzle 56 can rotate around the axis thereof as a central axis. In addition, an exhaust pipe 59 is disposed in CVD apparatus 50, and the exhaust gas can be discharged to the outside from an exhaust port 60 of exhaust pipe 59. The jigs and the like in reaction vessel 53 are usually constituted by graphite.

When the coating includes at least one of a base layer, an intermediate layer, and a surface layer, these layers can be formed by a conventionally known method.

As raw material gases, $TiCl_4$, $SiCl_4$, and $CH_3CN$ are used. $TiCl_4$ is ejected from a plurality of first jet holes provided in a nozzle, $SiCl_4$ is ejected from a plurality of second jet holes provided in the nozzle, and $CH_3CN$ is ejected from a plurality of third jet holes provided in the nozzle. Specifically, $TiCl_4$ is introduced into nozzle 56 from introduction port 55 of the nozzle and ejected from the plurality of first jet holes 61. $SiCl_4$ is introduced into nozzle 56 from introduction port 57 of the nozzle and ejected from the plurality of second jet holes 62. $CH_3CN$ is introduced into nozzle 56 from an introduction port (not shown) of the nozzle and ejected from the plurality of third jet holes (not shown). $H_2$ gas, $N_2$ gas, Ar gas, or the like can be used as a carrier gas. In the present disclosure, a gas including a raw material gas and a carrier gas is referred to as a reaction gas.

When the hard particle layer is formed, the following conditions (i) and (ii) are adopted.

(i) The percentage (V1/V)×100 of the volume flow rate V1 of $CH_3CN$ to the volume flow rate V of the entire reaction gas is varied. For example, the percentage (V1/V)×100 is gradually increased between the start and the end of formation of the hard particle layer.

(ii) The percentage ($V_{Si}/V_{Ti+Si}$)×100 of the flow rate $V_{Si}$ of $SiCl_4$ to the total flow rate $V_{Ti+Si}$ of $TiCl_4$ and $SiCl_4$ is varied. For example, the percentage ($V_{Si}/V_{Ti+Si}$)×100 is increased between the start and the end of formation of the hard particle layer.

By adopting the above conditions (i) and (ii), the composition of each of the first region and the second region of the hard particle layer can be varied. An adjustment can be made such that Xs and Xb satisfy the relationships of Xs-Xb 0.01 and 0<Xb<Xs≤0.10 in the composition $Ti_{(1-Xb)}Si_{Xb}CN$ of the first region and the composition $Ti_{(1-Xs)}Si_{Xs}CN$ of the second region.

Increasing the base material temperature when the hard particle layer is formed is also effective in order to make an adjustment such that Xs and Xb satisfy the relationships of Xs-Xb 0.01 and 0<Xb<Xs≤0.10 in the composition $Ti_{(1-Xb)}Si_{Xb}CN$ of the first region and the composition $Ti_{(1-Xs)}Si_{Xs}CN$ of the second region. In particular, in order to set Xb to 0.07 or more and Xs to 0.09 or more in the composition $Ti_{(1-Xb)}Si_{Xb}CN$ of the first region and the composition $Ti_{(1-Xs)}Si_{Xs}CN$ of the second region, increasing the base material temperature when the hard particle layer is formed is effective.

When the hard particle layer is formed, film formation is carried out while rotating the nozzle. Thereby, in the hard particles, the concentration of silicon changes periodically along the growth direction of the hard particle layer.

In the present step, the base material temperature in the reaction vessel is 800° C. to 900° C., and the pressure in the reaction vessel is 50 hPa to 300 hPa. The thickness of the hard particle layer can be controlled by regulating the flow rates of the raw material gases and the film formation time. The period width of the concentration of silicon in the hard particles can be controlled by regulating the rotation speed of the nozzle and the film formation time.

The total gas flow rate of the reaction gas during the formation of the hard particle layer can be, for example, 70 L/min to 90 L/min. Here, the term "total gas flow rate" refers to the total volume flow rate introduced into a CVD furnace per unit time, assuming that a gas under the standard conditions (0° C., 1 atm) is an ideal gas.

(Other Steps)

Next, base material 10 with a coating formed thereon is cooled. The cooling rate does not exceed, for example, 5° C./min, and the cooling rate slows as the temperature of base material 10 decreases.

In addition to the above steps, a heat treatment step such as annealing or a surface treatment step such as surface grinding or shot blasting can be carried out.

The cutting tool of Embodiment 1 can be obtained by the manufacturing method described above.

EXAMPLES

The present embodiment will be described more specifically with reference to Examples. However, the present embodiment is not limited by these Examples.

<Preparation of Base Material>

As the base material, a base material made of a cemented carbide was prepared. The composition of the base material is Co: 6% by mass, NbC: 1.5% by mass with the balance being WC. The shape of the base material is CNMG120408N-GZ (indexable cutting insert manufactured by Sumitomo Electric Hardmetal Corp.).

<Formation of Coating>

A coating was formed on the surface of the base material by a CVD method. The configuration of the coating of each sample and the average thickness of each layer are shown in Table 1, Table 2, and Table 3. In addition, a cell shown by "—" in Table means that no layer is present.

TABLE 1

| Sample No. | Base layer TiN layer/ average thickness μm | Intermediate layer TiCN layer/ average thickness μm | Hard particle layer Average thickness μm | Surface layer $Al_2O_3$ layer/ average thickness μm |
|---|---|---|---|---|
| 1 | — | — | 8.3 | — |
| 2 | — | — | 8.1 | — |
| 3 | — | — | 8.5 | — |
| 4 | — | — | 8.2 | — |
| 5 | — | — | 8.4 | — |
| 6 | — | — | 8.1 | — |
| 7 | — | — | 8.2 | — |
| 8 | — | — | 8.1 | — |
| 9 | — | — | 2.1 | — |
| 10 | — | — | 15.1 | — |
| 11 | 0.2 | 1.0 | 8.4 | — |
| 12 | — | — | 8.3 | 2.0 |
| 13 | — | — | 8.3 | — |
| 14 | — | — | 8.3 | — |
| 15 | — | — | 8.2 | — |
| 101 | — | — | 8.1 | — |
| 102 | — | — | 8.5 | — |
| 103 | — | — | 8.2 | — |

TABLE 2

| Sample No. | Base layer TiN layer/ average thickness μm | Intermediate layer TiCN layer/ average thickness μm | Hard particle layer Average thickness μm | Surface layer $Al_2O_3$ layer/ average thickness μm |
|---|---|---|---|---|
| 16 | — | — | 8.5 | — |
| 17 | — | — | 8.1 | — |
| 18 | — | — | 8.6 | — |
| 19 | — | — | 8.0 | — |
| 20 | — | — | 8.1 | — |
| 21 | — | — | 8.6 | — |
| 22 | — | — | 8.5 | — |
| 23 | — | — | 2.3 | — |
| 24 | — | — | 15.0 | — |
| 25 | 0.2 | 1.0 | 8.4 | — |
| 26 | — | — | 8.3 | 2.0 |
| 27 | — | — | 8.2 | — |
| 104 | — | — | 8.3 | — |
| 105 | — | — | 8.4 | — |
| 106 | — | — | 8.3 | — |

TABLE 3

| Sample No. | Base layer TiN layer/ average thickness μm | Intermediate layer TiCN layer/ average thickness μm | Hard particle layer Thickness μm | Surface layer $Al_2O_3$ layer/ average thickness μm |
|---|---|---|---|---|
| 28 | — | — | 8.5 | — |
| 29 | — | — | 8.1 | — |
| 30 | — | — | 8.6 | — |
| 31 | — | — | 8.0 | — |
| 32 | — | — | 8.1 | — |
| 33 | — | — | 8.6 | — |

TABLE 3-continued

| Sample No. | Base layer TiN layer/ average thickness μm | Intermediate layer TiCN layer/ average thickness μm | Hard particle layer Thickness μm | Surface layer Al₂O₃ layer/ average thickness μm |
|---|---|---|---|---|
| 34 | — | — | 8.5 | — |
| 35 | — | — | 2.3 | — |
| 36 | — | — | 15.0 | — |
| 37 | 0.2 | 1.0 | 8.4 | — |
| 38 | — | — | 8.3 | 2.0 |
| 39 | — | — | 8.2 | — |
| 107 | — | — | 8.3 | — |
| 108 | — | — | 8.4 | — |
| 109 | — | — | 8.3 | — |

The base layer (TiN layer), the intermediate layer (TiCN layer), and the surface layer (Al₂O₃ layer) shown in Table are layers formed by a conventionally known CVD method.

The hard particle layer of each sample shown in Table is formed by using the CVD apparatus shown in FIG. 6. First jet holes, second jet holes, and third jet holes are provided in the nozzle of the CVD apparatus. In each sample, the nozzle rotation speed, the base material temperature, and the pressure when the hard particle layer was formed are as shown in Table 4, Table 5, and Table 6.

TABLE 4

Formation conditions for hard particle layer

| Sample No. | (V1/V) × 100 | ($V_{Si}/V_{Ti+Si}$) × 100 | Nozzle rotation speed rpm | Base material temperature ° C. | Pressure hPa |
|---|---|---|---|---|---|
| 1 | 0.4%→0.5% | 20%→25% | 2.00 | 850 | 90 |
| 2 | 0.4%→0.6% | 20%→30% | 2.00 | 850 | 90 |
| 3 | 0.5%→0.6% | 25%→30% | 2.00 | 850 | 90 |
| 4 | 0.6%→0.8% | 30%→35% | 2.00 | 850 | 90 |
| 5 | 0.4%→0.6% | 20%→30% | 10.00 | 850 | 90 |
| 6 | 0.4%→0.6% | 20%→30% | 6.50 | 850 | 90 |
| 7 | 0.4%→0.6% | 20%→30% | 1.00 | 850 | 90 |
| 8 | 0.4%→0.6% | 20%→30% | 0.65 | 850 | 90 |
| 9 | 0.4%→0.6% | 20%→30% | 2.00 | 850 | 90 |
| 10 | 0.4%→0.6% | 20%→30% | 2.00 | 850 | 90 |
| 11 | 0.4%→0.6% | 20%→30% | 2.00 | 850 | 90 |
| 12 | 0.4%→0.6% | 20%→30% | 2.00 | 850 | 90 |
| 13 | 0.4%→0.75% | 20%→35% | 2.00 | 850 | 90 |
| 14 | 0.4%→0.9% | 20%→45% | 2.00 | 850 | 90 |
| 15 | 0.4%→0.6% | 20%→30% | 2.00 | 850 | 150 |
| 101 | 0.4% | 20% | 2.00 | 850 | 90 |
| 102 | 0.5% | 25% | 2.00 | 850 | 90 |
| 103 | 0.6% | 30% | 2.00 | 850 | 90 |

TABLE 5

Formation conditions for hard particle layer

| Sample No. | (V1/V) × 100 | ($V_{Si}/V_{Ti+Si}$) × 100 | Nozzle rotation speed rpm | Base material temperature ° C. | Pressure hPa |
|---|---|---|---|---|---|
| 16 | 0.6%→0.7% | 30%→35% | 2.00 | 855 | 90 |
| 17 | 0.6%→0.9% | 30%→45% | 2.00 | 850→870 | 90 |
| 18 | 0.8%→0.9% | 30%→35% | 2.00 | 855 | 90 |
| 19 | 0.6%→0.8% | 30%→35% | 10.00 | 860 | 90 |
| 20 | 0.6%→0.8% | 30%→35% | 6.50 | 855 | 90 |
| 21 | 0.6%→0.8% | 30%→35% | 1.00 | 855 | 90 |
| 22 | 0.6%→0.8% | 30%→35% | 0.65 | 855 | 90 |
| 23 | 0.6%→0.8% | 30%→35% | 2.00 | 855 | 90 |
| 24 | 0.6%→0.8% | 30%→35% | 2.00 | 855 | 90 |
| 25 | 0.6%→0.8% | 30%→35% | 2.00 | 855 | 90 |
| 26 | 0.6%→0.8% | 30%→35% | 2.00 | 855 | 90 |
| 27 | 0.6%→0.8% | 30%→35% | 2.00 | 855 | 150 |
| 104 | 0.6% | 30% | 2.00 | 850 | 90 |
| 105 | 0.7% | 40% | 2.00 | 850 | 90 |
| 106 | 0.8% | 40% | 2.00 | 860 | 90 |

TABLE 6

Formation conditions for hard particle layer

| Sample No. | (V1/V) × 100 | ($V_{Si}/V_{Ti+Si}$) × 100 | Nozzle rotation speed rpm | Base material temperature ° C. | Pressure hPa |
|---|---|---|---|---|---|
| 28 | 0.8%→0.85% | 40→45% | 2.00 | 860 | 90 |
| 29 | 0.8%→0.9% | 40→45% | 2.00 | 860→870 | 90 |
| 30 | 0.85%→0.9% | 43→45% | 2.00 | 865→870 | 90 |
| 31 | 0.8%→0.9% | 40→45% | 10.00 | 860→865 | 90 |
| 32 | 0.8%→0.9% | 40→45% | 6.50 | 860→865 | 90 |
| 33 | 0.8%→0.9% | 40→45% | 1.00 | 860→865 | 90 |
| 34 | 0.8%→0.9% | 40→45% | 0.65 | 860→865 | 90 |
| 35 | 0.8%→0.9% | 40→45% | 2.00 | 860→865 | 90 |
| 36 | 0.8%→0.9% | 40→45% | 2.00 | 860→865 | 90 |
| 37 | 0.8%→0.9% | 40→45% | 2.00 | 860→865 | 90 |
| 38 | 0.8%→0.9% | 40→45% | 2.00 | 860→865 | 90 |
| 39 | 0.8%→0.9% | 40→45% | 2.00 | 860→865 | 150 |
| 107 | 0.8% | 40% | 2.00 | 860 | 90 |
| 108 | 0.8% | 45% | 2.00 | 860 | 90 |
| 109 | 0.9% | 45% | 2.00 | 870 | 90 |

In sample 1 to sample 39, the percentage (V1/V)×100 of the volume flow rate V1 of CH₃CN to the volume flow rate V of the entire reaction gas was gradually increased between the start and the end of formation of the hard particle layer. The changes in the percentage (V1/V)×100 are as shown in Table 4, Table 5, and Table 6. For example, in sample 1, the percentage (V1/V)×100 was gradually increased from 0.4% to 0.5%.

In sample 101 to sample 109, the percentage (V1/V)×100 was kept constant during the formation of the hard particle layer. The percentage (V1/V)×100 is as shown in Table 4, Table 5, and Table 6. For example, in sample 101, the percentage (V1/V)×100 was kept at 0.4%.

In sample 1 to sample 39, the percentage ($V_{Si}/V_{Ti+Si}$)×100 of the flow rate $V_{Si}$ of SiCl₄ to the total flow rate $V_{Ti+Si}$ of TiCl₄ and SiCl₄ was increased between the start and the end of formation of the hard particle layer. The changes in the percentage ($V_{Si}/V_{Ti+Si}$)×100 are as shown in Table 4, Table 5, and Table 6. For example, in sample 1, the percentage ($V_{Si}/V_{Ti+Si}$)×100 was increased from 20% to 25%.

In sample 101 to sample 109, the percentage ($V_{Si}/V_{Ti+Si}$)×100 was kept constant during the formation of the hard particle layer. The percentage ($V_{Si}/V_{Ti+Si}$)×100 is as shown in Table 4, Table 5, and Table 6. For example, in sample 101, the percentage ($V_{Si}/V_{Ti+Si}$)×100 was kept at 20%.

In sample 17 and samples 29 to 39, the base material temperature was increased during the formation of the hard particle layer. The changes in the base material temperature are as shown in Table 5 and Table 6. For example, in sample 17, the base material temperature was increased from 850° C. to 870° C. In the other samples, the base material temperature was kept constant during the formation of the hard particle layer.

After that, the base material was cooled to obtain a cutting tool of each sample.

<Configuration of Hard Particle Layer>

In the cutting tool of each sample, when the hard particle layer was observed with a bright-field scanning electron microscope (BF-SEM), it was confirmed that the hard particle layer was formed from a plurality of hard particles.

<Composition of Hard Particle Layer>

In the cutting tool of each sample, the composition $Ti_{(1-Xb)}Si_{Xb}CN$ of the first region and the composition $Ti_{(1-Xs)}Si_{Xs}CN$ of the composition of the second region were measured by SEM-EDX. The specific measurement method is as described in Embodiment 1. Based on the results obtained, Xb, Xs, and Xs-Xb are shown in Table 7, Table 8, Table 9.

<Crystal Structure of Hard Particles>

In the hard particle layer of the cutting tool of each sample, the crystal structure of hard particles was confirmed by pattern analysis of selected area electron beam diffraction. Results thereof are shown in Table 7, Table 8, and Table 9. In the tables, "Cubic" indicates that the hard particles have a cubic crystal structure. In the tables, "Cubic+amorphous" indicates that the hard particles include a cubic crystal structure and an amorphous structure.

<Changes in Silicone Concentration in Hard Particles>

In the hard particles of the cutting tool of each sample, changes in the concentration of silicon along the first direction going from the first main surface to the second main surface of the hard particle layer were confirmed. In the hard particles in all the samples, it was confirmed that the concentration of silicon changed periodically along the first direction going from the first main surface to the second main surface of the hard particle layer.

<Period Width of Concentration of Silicon in Hard Particles>

In the hard particles of the cutting tool of each sample, the period width of the concentration of silicon along the first direction going from the first main surface to the second main surface of the hard particle layer was measured. The specific measurement method is as described in Embodiment 1. Results thereof are shown in "Period width of Si concentration" in Table 7, Table 8, and Table 9.

<Structure of Hard Particle Layer>

In the hard particle layer of the cutting tool of each sample, the percentage (N1/N)×100 of the number N1 of first hard particles having an aspect ratio of 3 or more to the number N of all hard particles constituting the hard particle layer was measured. The specific measurement method is as described in Embodiment 1. Results thereof are shown in Table 7, Table 8, and Table 9.

When the value of the percentage (N1/N)×100 in each sample is 50% or more, it is determined that the hard particle layer has a columnar structure.

<L/T>

In the cutting tool of each sample, the proportion L/T of the length L along the first direction of the hard particles to the thickness T of the hard particle layer was measured. The specific measurement method is as described in Embodiment 1. Results thereof are shown in Table 7, Table 8, and Table 9.

TABLE 7

| | Hard particle layer | | | | | | |
|---|---|---|---|---|---|---|---|
| Sample No. | First region $Ti_{(1-Xb)}Si_{Xb}CN$ Xb | Second region $Ti_{(1-Xs)}Si_{Xs}CN$ Xs | Xs-Xb | Period width of Si concentration nm | Crystal structure | (N1/N) × 100 % | L/T |
| 1 | 0.01 | 0.02 | 0.01 | 10 | Cubic | 68 | 0.49 |
| 2 | 0.01 | 0.03 | 0.02 | 10 | Cubic | 71 | 0.59 |
| 3 | 0.02 | 0.03 | 0.01 | 10 | Cubic | 72 | 0.56 |
| 4 | 0.03 | 0.06 | 0.03 | 10 | Cubic | 70 | 0.51 |
| 5 | 0.01 | 0.03 | 0.02 | 2 | Cubic | 72 | 0.63 |
| 6 | 0.01 | 0.03 | 0.02 | 3 | Cubic | 70 | 0.62 |
| 7 | 0.01 | 0.03 | 0.02 | 20 | Cubic | 63 | 0.55 |
| 8 | 0.01 | 0.03 | 0.02 | 25 | Cubic | 65 | 0.51 |
| 9 | 0.01 | 0.03 | 0.02 | 10 | Cubic | 66 | 0.92 |
| 10 | 0.01 | 0.03 | 0.02 | 11 | Cubic | 68 | 0.45 |
| 11 | 0.01 | 0.03 | 0.02 | 10 | Cubic | 68 | 0.64 |
| 12 | 0.01 | 0.03 | 0.02 | 9 | Cubic | 73 | 0.63 |
| 13 | 0.01 | 0.05 | 0.04 | 10 | Cubic | 68 | 0.62 |
| 14 | 0.01 | 0.10 | 0.09 | 10 | Cubic | 64 | 0.55 |
| 15 | 0.01 | 0.03 | 0.02 | 10 | Cubic + amorphous | 32 | — |
| 101 | 0.01 | 0.01 | 0.00 | 10 | Cubic | 65 | 0.65 |
| 102 | 0.02 | 0.02 | 0.00 | 10 | Cubic | 70 | 0.55 |
| 103 | 0.03 | 0.03 | 0.00 | 10 | Cubic | 70 | 0.45 |

TABLE 8

| | Hard particle layer | | | | | | |
|---|---|---|---|---|---|---|---|
| Sample No. | First region $Ti_{(1-Xb)}Si_{Xb}CN$ Xb | Second region $Ti_{(1-Xs)}Si_{Xs}CN$ Xs | Xs-Xb | Period width of Si concentration nm | Crystal structure | (N1/N) × 100 % | L/T |
| 16 | 0.03 | 0.04 | 0.01 | 10 | Cubic | 70 | 0.53 |
| 17 | 0.03 | 0.10 | 0.07 | 10 | Cubic | 72 | 0.63 |
| 18 | 0.06 | 0.07 | 0.01 | 10 | Cubic | 70 | 0.62 |
| 19 | 0.04 | 0.06 | 0.02 | 2 | Cubic | 72 | 0.55 |
| 20 | 0.04 | 0.06 | 0.02 | 3 | Cubic | 65 | 0.64 |
| 21 | 0.04 | 0.06 | 0.02 | 20 | Cubic | 63 | 0.55 |
| 22 | 0.04 | 0.06 | 0.02 | 25 | Cubic | 65 | 0.56 |
| 23 | 0.04 | 0.06 | 0.02 | 10 | Cubic | 66 | 0.95 |
| 24 | 0.04 | 0.06 | 0.02 | 10 | Cubic | 63 | 0.58 |
| 25 | 0.04 | 0.06 | 0.02 | 10 | Cubic | 65 | 0.60 |
| 26 | 0.04 | 0.06 | 0.02 | 10 | Cubic | 69 | 0.54 |
| 27 | 0.04 | 0.06 | 0.02 | 10 | Cubic + amorphous | 32 | — |
| 104 | 0.03 | 0.03 | 0.00 | 10 | Cubic | 65 | 0.55 |
| 105 | 0.05 | 0.05 | 0.00 | 10 | Cubic | 60 | 0.54 |
| 106 | 0.07 | 0.07 | 0.00 | 10 | Cubic | 67 | 0.57 |

TABLE 9

| | Hard particle layer | | | | | | |
|---|---|---|---|---|---|---|---|
| Sample No. | First region $Ti_{(1-Xb)}Si_{Xb}CN$ Xb | Second region $Ti_{(1-Xs)}Si_{Xs}CN$ Xs | Xs-Xb | Period width of Si concentration nm | Crystal structure | (N1/N) × 100 % | L/T |
| 28 | 0.07 | 0.08 | 0.01 | 10 | Cubic | 65 | 0.55 |
| 29 | 0.07 | 0.10 | 0.03 | 10 | Cubic | 70 | 0.56 |
| 30 | 0.09 | 0.10 | 0.01 | 10 | Cubic | 70 | 0.62 |
| 31 | 0.07 | 0.09 | 0.02 | 2 | Cubic | 64 | 0.55 |
| 32 | 0.07 | 0.09 | 0.02 | 3 | Cubic | 63 | 0.58 |
| 33 | 0.07 | 0.09 | 0.02 | 20 | Cubic | 62 | 0.56 |
| 34 | 0.07 | 0.09 | 0.02 | 25 | Cubic | 61 | 0.53 |
| 35 | 0.07 | 0.09 | 0.02 | 10 | Cubic | 60 | 0.94 |

TABLE 9-continued

| | Hard particle layer | | | | | | |
|---|---|---|---|---|---|---|---|
| Sample No. | First region Ti$_{(1-Xb)}$Si$_{Xb}$CN Xb | Second region Ti$_{1-Xs}$Si$_s$CN Xs | Xs-Xb | Period width of Si concentration nm | Crystal structure | (N1/N) × 100 % | L/T |
| 36 | 0.07 | 0.09 | 0.02 | 10 | Cubic | 59 | 0.64 |
| 37 | 0.07 | 0.09 | 0.02 | 10 | Cubic | 61 | 0.61 |
| 38 | 0.07 | 0.09 | 0.02 | 10 | Cubic | 60 | 0.54 |
| 39 | 0.07 | 0.09 | 0.02 | 10 | Cubic + amorphous | 32 | — |
| 107 | 0.07 | 0.07 | 0.00 | 10 | Cubic | 59 | 0.55 |
| 108 | 0.08 | 0.08 | 0.00 | 10 | Cubic | 60 | 0.54 |
| 109 | 0.10 | 0.10 | 0.00 | 10 | Cubic | 61 | 0.57 |

<Cutting Test 1>

By using each of the cutting tools of sample 1 to sample 15 and sample 101 to sample 103, cutting was carried out under the following cutting conditions to measure the cutting time until the flank wear loss reached 0.2 mm. A longer cutting time shows a longer tool life. Results thereof are shown in Table 10.

<Cutting Conditions>
  Work material: FCD700 Round bar
  Holder: DCNL2525M12 (manufactured by Sumitomo Electric Hardmetal Corp.)
  Insert: CNMG120408N-GZ
  Cutting speed Vc: 100 m/min
  Feed f: 0.3 mm/rev
  Cutting depth Ap: 1.5 mm
  Cutting fluid: Present (WET)

TABLE 10

| Sample No. | Cutting test 1 Tool life (min) |
|---|---|
| 1 | 21 |
| 2 | 20 |
| 3 | 20 |
| 4 | 17 |
| 5 | 19 |
| 6 | 19 |
| 7 | 18 |
| 8 | 19 |
| 9 | 17 |
| 10 | 22 |
| 11 | 25 |
| 12 | 24 |
| 13 | 23 |
| 14 | 25 |
| 15 | 15 |
| 101 | 8 |
| 102 | 9 |
| 103 | 8 |

Evaluation

The cutting tools of sample 1 to sample 15 correspond to Examples. The cutting tools of sample 101 to sample 103 correspond to Comparative Examples. It was conformed that the cutting tools of sample 1 to sample 15 had a longer tool life when a workpiece having high cutting resistance is cut than the cutting tools of sample 101 to sample 103.

<Cutting Test 2>

By using each of the cutting tools of sample 16 to sample 27 and sample 104 to sample 106, cutting was carried out under the following cutting conditions to measure the cutting time until the flank wear loss reached 0.2 mm. A longer cutting time shows a longer tool life. Results thereof are shown in Table 11.

<Cutting Conditions>
  Work material: FCD700 Round bar
  Holder: DCNL2525M12 (manufactured by Sumitomo Electric Hardmetal Corp.)
  Insert: CNMG120408N-GZ
  Cutting speed Vc: 140 m/min
  Feed f: 0.3 mm/rev
  Cutting depth ap: 1.5 mm
  Cutting fluid: Present (WET)

TABLE 11

| Sample No. | Cutting test 2 Tool life (min) |
|---|---|
| 16 | 19 |
| 17 | 18 |
| 18 | 18 |
| 19 | 18 |
| 20 | 17 |
| 21 | 16 |
| 22 | 18 |
| 23 | 18 |
| 24 | 19 |
| 25 | 20 |
| 26 | 22 |
| 27 | 15 |
| 104 | 8 |
| 105 | 9 |
| 106 | 9 |

Evaluation

The cutting tools of sample 16 to sample 27 correspond to Examples. The cutting tools of sample 104 to sample 106 correspond to Comparative Examples. It was conformed that the cutting tools of sample 16 to sample 27 had a longer tool life when a workpiece having high cutting resistance is cut than the cutting tools of sample 104 to sample 106.

<Cutting Test 3>

By using each of the cutting tools of sample 28 to sample 39 and sample 107 to sample 109, cutting was carried out under the following cutting conditions to measure the cutting time until the flank wear loss reached 0.2 mm. A longer cutting time shows a longer tool life. Results thereof are shown in Table 12.

<Cutting Conditions>
  Workpiece: FCD700 Round bar
  Holder: DCNL2525M12 (manufactured by Sumitomo Electric Hardmetal Corp.)
  Insert: CNMG120408N-GZ
  Cutting speed Vc: 180 m/min
  Feed f: 0.3 mm/rev
  Cutting depth ap: 1.5 mm
  Cutting fluid: Present (WET)

TABLE 12

| Sample No. | Cutting test 3 Tool life (min) |
|---|---|
| 28 | 17 |
| 29 | 16 |
| 30 | 16 |

TABLE 12-continued

| Sample No. | Cutting test 3 Tool life (min) |
|---|---|
| 31 | 16 |
| 32 | 15 |
| 33 | 16 |
| 34 | 15 |
| 35 | 16 |
| 36 | 17 |
| 37 | 19 |
| 38 | 21 |
| 39 | 14 |
| 107 | 7 |
| 108 | 8 |
| 109 | 8 |

Evaluation

The cutting tools of sample 28 to sample 39 correspond to Examples. The cutting tools of sample 107 to sample 109 correspond to Comparative Examples. It was conformed that the cutting tools of sample 28 to sample 39 had a longer tool life when a workpiece having high cutting resistance is cut than the cutting tools of sample 107 to sample 109.

The embodiments and Examples of the present disclosure have been described as above, and it is also planned from the beginning to appropriately combine the configurations of the embodiments and Examples described above and to modify these in various ways.

The embodiments and the Examples disclosed this time should be considered to be illustrative in all respects and non-limiting. The scope of the present invention is defined by the Claims, not by the above embodiments and Examples, and is intended to include all modifications within the meaning and scope equivalent to the claims.

REFERENCE SIGNS LIST

1 Cutting tool, 10 Base material, 11 Hard particle layer, 12 Base layer, 13 Surface layer, 14 Intermediate layer, 15 Coating, 50 CVD apparatus, 52 Base material setting jig, 53 Reaction vessel, 54 Temperature control apparatus, 55, 57 Introduction port, 56 Nozzle, 59 Exhaust pipe, 60 Exhaust port, 61 First jet hole, 62 Second jet hole, A1 First region, A2 Second region, S1, S2 Virtual surface

The invention claimed is:

1. A cutting tool comprising a base material and a coating disposed on the base material, wherein
the coating comprises a hard particle layer,
the hard particle layer is formed from a plurality of hard particles consisting of titanium, silicon, carbon, and nitrogen,
the hard particle layer comprises a first region and a second region,
the first region is a region sandwiched between a first main surface of the hard particle layer facing forward the base material and a virtual surface S1 at a distance of 0.5 μm from the first main surface toward the hard particle layer,
the second region is a region sandwiched between a second main surface of the hard particle layer opposite to the first main surface and a virtual surface S2 at a distance of 0.5 μm from the second main surface toward the hard particle layer,
a composition of the first region is $Ti_{(1-Xb)}Si_{Xb}CN$,
a composition of the second region is $Ti_{(1-Xs)}Si_{Xs}CN$,
the Xs and the Xb satisfy relationships of $Xs-Xb \geq 0.01$ and $0 < Xb < Xs \leq 0.10$,
the hard particles have a cubic crystal structure, and
in the hard particles, a concentration of the silicon changes periodically along a first direction going from the first main surface to the second main surface.

2. The cutting tool according to claim 1, wherein the hard particle layer has a columnar structure.

3. The cutting tool according to claim 2, wherein a proportion L1/T1 of a length L1 along the first direction of the hard particles to a thickness T1 of the hard particle layer is 0.3 or more.

4. The cutting tool according to claim 1, wherein a period width of a concentration of the silicon along the first direction in the hard particles is 3 nm or more and 20 nm or less.

5. The cutting tool according to claim 1, wherein an average thickness of the hard particle layer is 2 μm or more and 15 μm or less.

6. The cutting tool according to claim 1, wherein
the coating comprises a base layer provided between the base material and the hard particle layer, and
the base layer comprises at least one selected from the group consisting of a TiN layer, a TiC layer, a TiCN layer, a TiBN layer, a TiCNO layer, and an $Al_2O_3$ layer.

7. The cutting tool according to claim 1, wherein
the coating comprises a surface layer provided on a topmost surface of the coating, and
the surface layer is a TiN layer or an $Al_2O_3$ layer.

* * * * *